US00RE44376E

(19) United States
(12) Reissued Patent
Shiau et al.

(10) Patent Number: US RE44,376 E
(45) Date of Reissued Patent: Jul. 16, 2013

(54) SILICON SUBSTRATE WITH REDUCED SURFACE ROUGHNESS

(75) Inventors: Gwo-Yuh Shiau, Hsin-Chu (TW); Ming Chyi Liu, Hsin-Chu (TW); Tzu-Hsuan Hsu, Kaohsiung (TW); Chia-Shiung Tsai, Hsin-Chu (TW)

(73) Assignee: Taiwan Semiconductor Manufacturing Company, Ltd., Hsin-Chu (TW)

(21) Appl. No.: 13/117,881

(22) Filed: May 27, 2011

Related U.S. Patent Documents

Reissue of:
(64) Patent No.: 7,863,067
Issued: Jan. 4, 2011
Appl. No.: 11/686,108
Filed: Mar. 14, 2007

(51) Int. Cl.
*H01L 21/00* (2006.01)

(52) U.S. Cl.
USPC ..... 438/45; 257/E21.135

(58) Field of Classification Search
USPC ..... 257/447, E23.135; 438/45
See application file for complete search history.

(56) References Cited

U.S. PATENT DOCUMENTS

| | | | | |
|---|---|---|---|---|
| 5,688,715 | A | 11/1997 | Sexton et al. | |
| 6,169,319 | B1 * | 1/2001 | Malinovich et al. | 257/447 |
| 6,924,163 | B2 | 8/2005 | Okazaki et al. | |
| 7,095,050 | B2 | 8/2006 | Wanlass et al. | |
| 2006/0076590 | A1 | 4/2006 | Pain et al. | |

* cited by examiner

*Primary Examiner* — Jenny L Wagner
(74) *Attorney, Agent, or Firm* — Haynes and Boone, LLP

(57) ABSTRACT

The present disclosure provides a method for fabricating a semiconductor device including providing a semiconductor substrate comprising a first surface and a second surface, wherein at least one imaging sensor is located adjacent the first surface, activating a dopant layer in the semiconductor substrate adjacent the second surface using a localized annealing process, and etching the dopant layer.

16 Claims, 9 Drawing Sheets

SILICON SUBSTRATE WITH REDUCED SURFACE ROUGHNESS

Matter enclosed in heavy brackets [ ] appears in the original patent but forms no part of this reissue specification; matter printed in italics indicates the additions made by reissue.

BACKGROUND

In semiconductor technologies, backside-illuminated sensors are used for sensing a volume of exposed light projected towards the backside surface of a substrate. The backside-illuminated sensors can be formed on the front side of the substrate and light projected towards the backside of the substrate can reach the sensors. However, annealing processes used to fabricate the backside-illuminated sensors can result in surface roughness that can effect the light photo response of the backside-illuminated sensors. Improvements in backside illuminated sensors and/or the methods of fabricating backside illuminated sensors are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
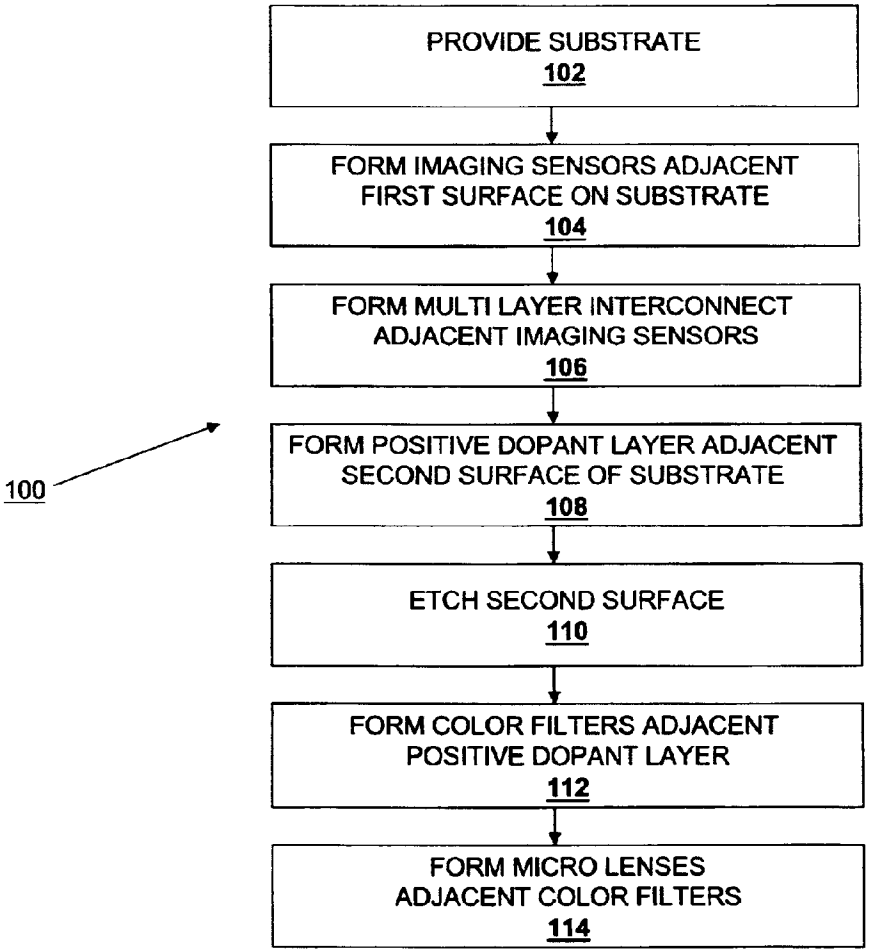
FIG. 1 illustrates a flow chart of one embodiment of a method for fabricating a semiconductor device according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring now to FIG. 1, a method 100 for fabricating a semiconductor device is illustrated. In the illustrated embodiment, the method 100 is used to fabricate a backside illuminated imaging sensor. However, one of skill in the art will recognize that the processes and techniques disclosed in the method 100 may be used to fabricate a variety of different semiconductor devices known in the art.

Figure 2:
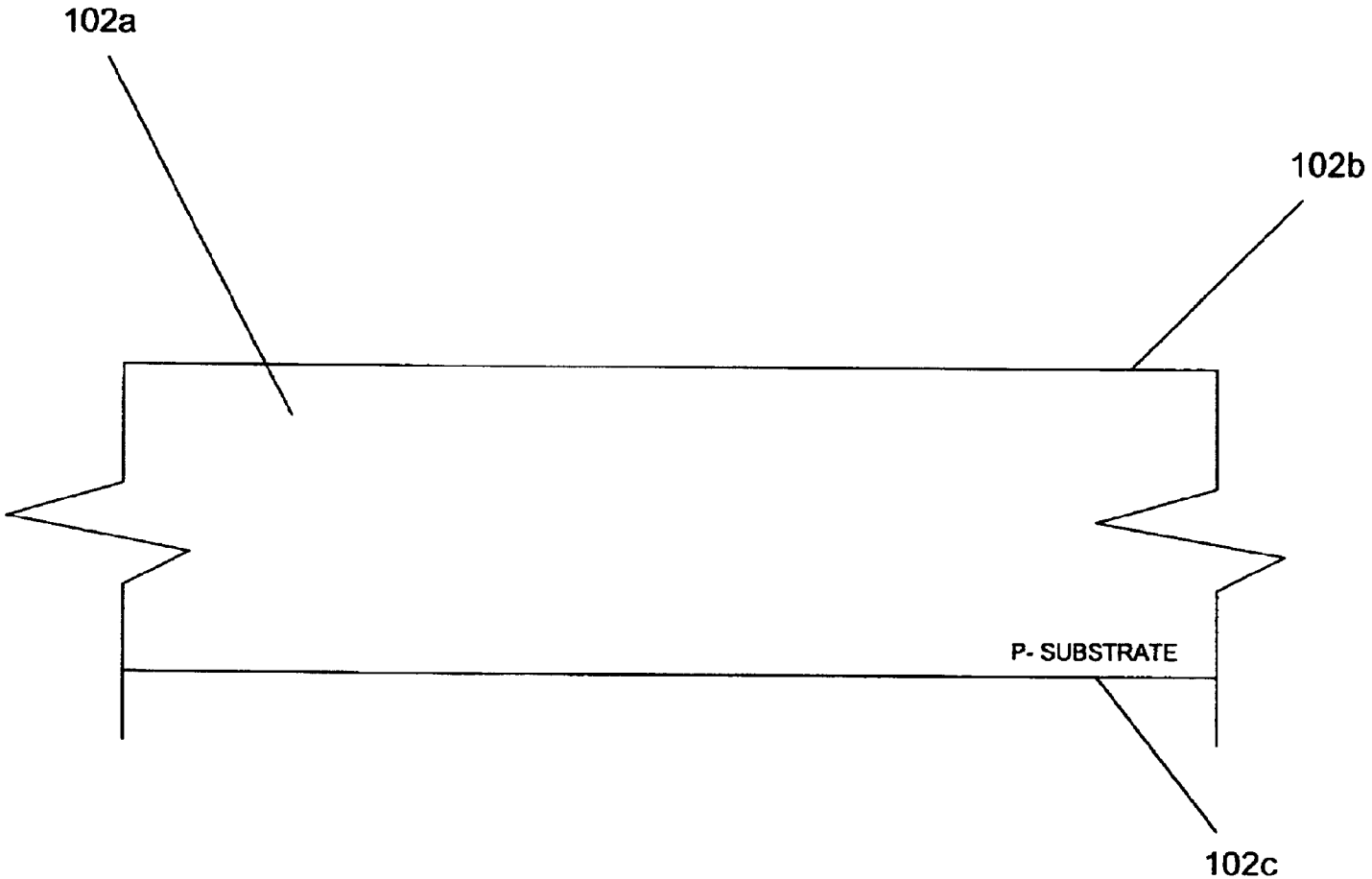
FIG. 2 illustrates a cross sectional view of one embodiment of a semiconductor substrate provided according to aspects of the present disclosure.

Referring now to FIGS. 1 and 2, the method begins at step 102 where a semiconductor substrate 102a is provided. The semiconductor substrate 102a includes a first surface 102b and a second surface 102c that is located opposite the semiconductor substrate 102a from the first surface 102a. The semiconductor substrate 102a includes silicon. The semiconductor substrate 102a may alternatively or additionally include other elementary semiconductor materials such as germanium and diamond. The semiconductor substrate 102a may also include a compound semiconductor such as silicon carbide, gallium arsenic, indium arsenide, and indium phosphide. The semiconductor substrate 102a may include an alloy semiconductor such as silicon germanium, silicon germanium carbide, gallium arsenic phosphide, and gallium indium phosphide. The semiconductor substrate 102a may include various p-type doped regions and/or n-type doped regions. All doping may be implemented using a process such as ion implantation or diffusion in various steps and techniques. The semiconductor substrate 102a may include conventional isolation features, known in the art, to separate different devices formed in the semiconductor substrate 102a. The semiconductor substrate 102a may include other features such as an epi layer, a semiconductor on insulator (SOI) structure, or combinations thereof.

Figure 3:
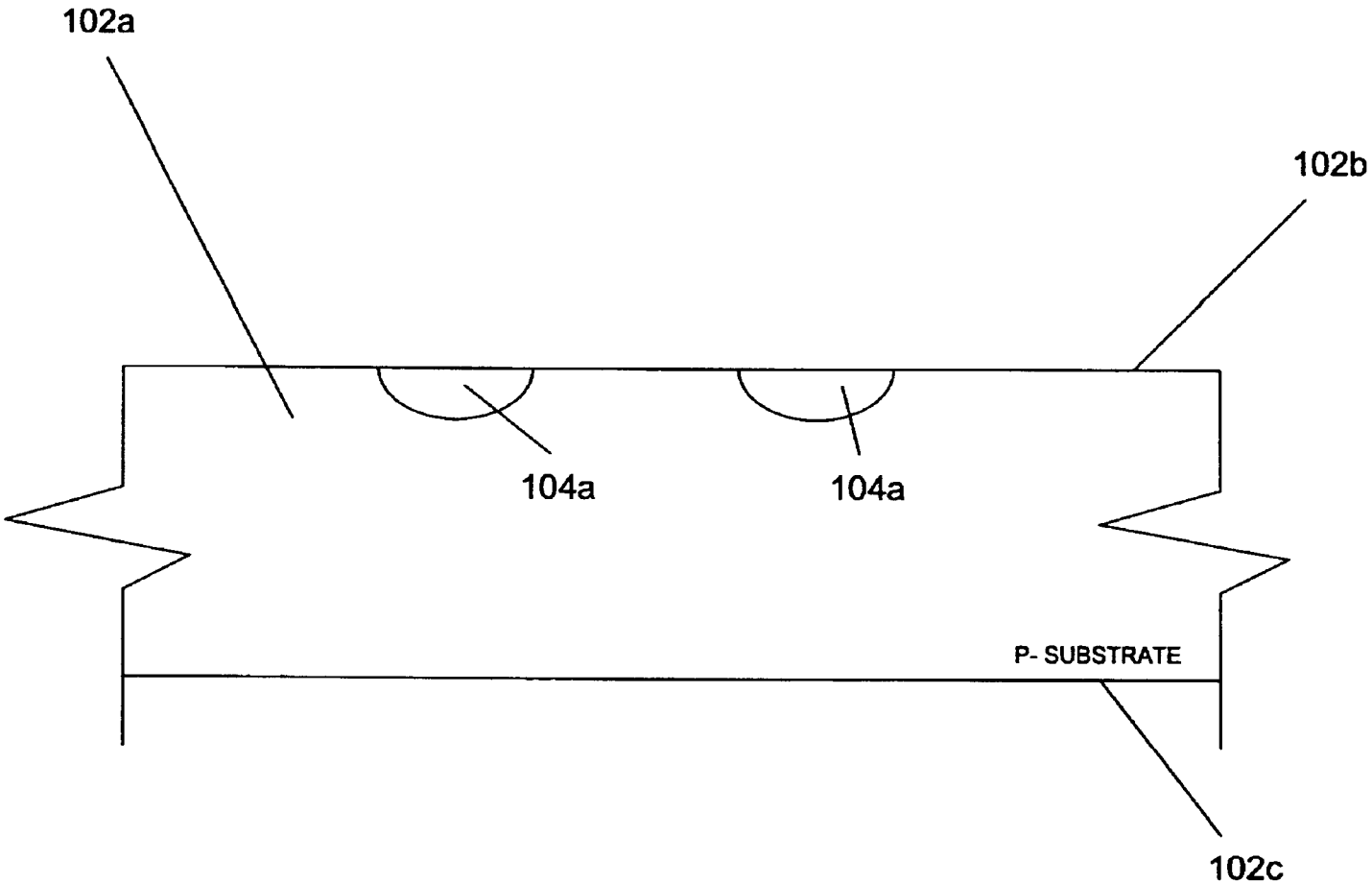
FIG. 3 illustrates a cross sectional view of one embodiment of a plurality of imaging sensors formed on the semiconductor substrate of FIG. 2 according to aspects of the present disclosure.

Referring now to FIGS. 1 and 3, the method 100 proceeds to step 104 where imaging sensors are formed adjacent the first surface 102b on the semiconductor substrate 102a. A plurality of imaging sensors 104a are formed adjacent the first surface 102b of the semiconductor substrate 102a using methods known in the art. In one embodiment, the imaging sensors 104a may be disposed over the first surface 102b of the semiconductor substrate 102a and extended into the semiconductor substrate 102a. In another embodiment, the imaging sensors 104a may be disposed above the first surface 102b of the semiconductor substrate 102a. The imaging sensors 104a each may include a light-sensing region (or photo-sensing region) which may be a doped region having N-type and/or P-type dopants formed in the semiconductor substrate 102a by a method such as diffusion or ion implantation. The light-sensing region may have a doping concentration ranging between about $10^{14}$ and $10^{21}$ atoms/cm$^3$. The light-sensing region may have a surface area ranging between about 10% and 80% area of the associated sensor element, being operable to receive light (or radiation from an object to be imaged) illuminated on. The imaging sensors 104a may include photosensitive diodes or photodiodes for recording an intensity or brightness of light on the diode. The imaging sensors 104a can be of various different types, including complimentary metal-oxide-semiconductor (CMOS) image sensors, charged coupling device (CCD) sensors, active sensor, passive sensor, and/or other sensors diffused or otherwise formed in the semiconductor substrate 102a. As such, the imaging sensors 104a may comprise conventional and/or future-developed image sensing devices. The imaging sensors 104a may include a plurality of pixels disposed in a sensor array or other proper configuration. The plurality of sensor pixels may be designed having various sensor types. For example, one group of sensor pixels may be CMOS image sensors and another group of sensor pixels may be passive sensors. Other types of pixels may include reset transistors, source follower transistors, pinned layer photodiodes, and transfer transistors. Additional circuitry and inputs/outputs are typically provided adjacent to the pixels for providing an operation environment for the pixels and for supporting external communications with the pixels. Moreover, the imaging sensors 104a may include color image sensors and/or monochromatic image sensors. The semiconductor substrate 102 is designed such that the imaging sensors 104a may receive light (or radiation) directed towards the second surface 102c of the semiconductor substrate 102a during applications, eliminating obstructing the optical paths by other objects such as gate features and metal lines, and maximizing the exposure of the light-sensing region to the illuminated light. The substrate 102a may be thinned such that the light directed through the second surface 102c of the semiconductor substrate 102a thereof may effectively reach the imaging sensors 104a.

Figure 4:
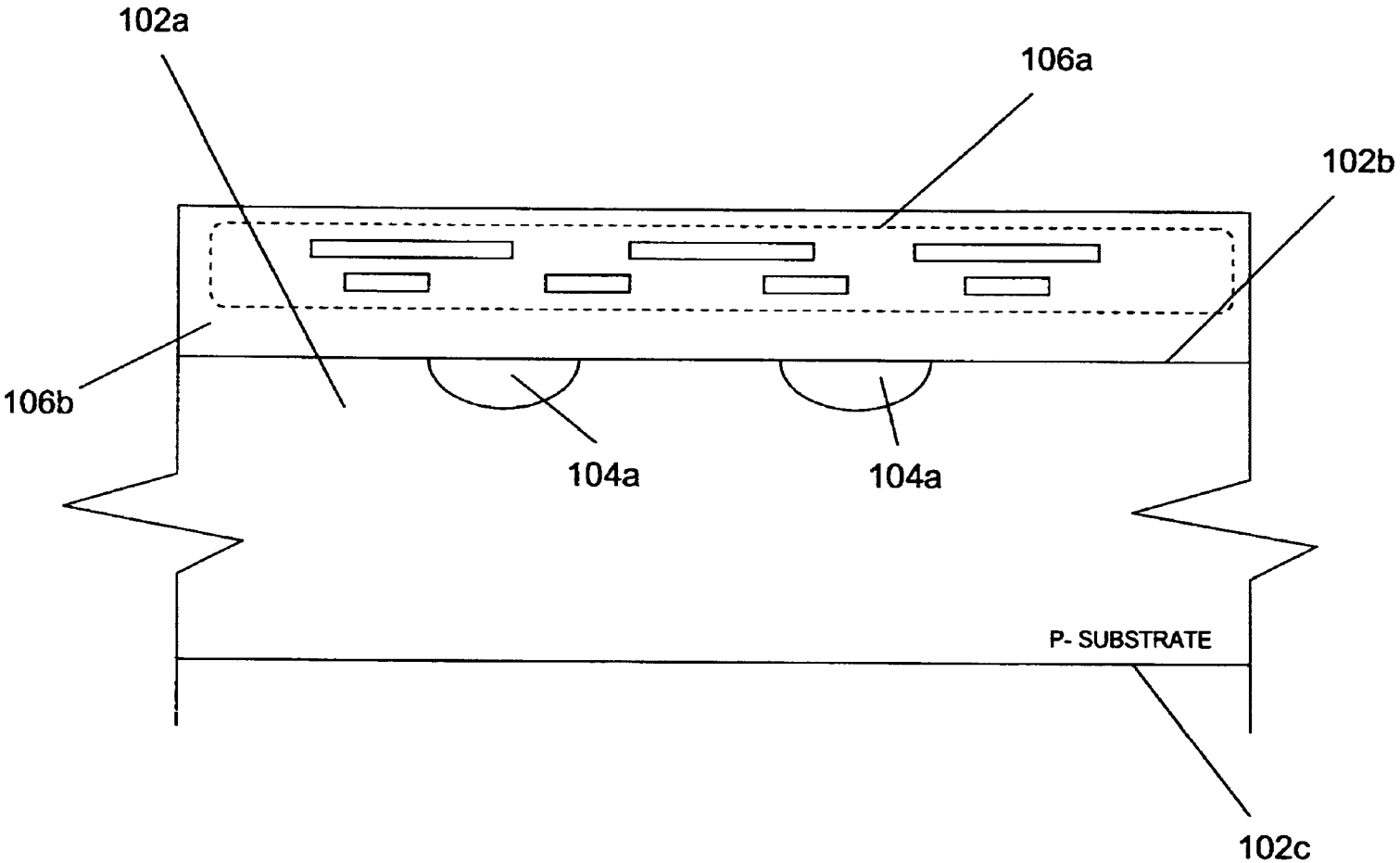
FIG. 4 illustrates a cross sectional view of one embodiment of a multi layer interconnect formed on the semiconductor substrate of FIG. 3 according to aspects of the present disclosure.

Referring now to FIGS. 1 and 4, the method 100 proceeds to step 106 where a multi layer interconnect is formed on the first surface 102b of the semiconductor substrate 102a and adjacent the imaging sensors 104a. A multilayer interconnect (MLI) 106a is formed on the first surface 102b of the semiconductor substrate 102a and coupled to the imaging sensors 104a such that the imaging sensors 104a are operable to properly respond to illuminated light (imaging radiation). The multilayer interconnect (MLI) 106a may be formed on the semiconductor substrate 102a and disposed on the first surface 102b overlying the imaging sensors 104a. The multilayer interconnect 106a may include conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide. Alternatively, copper multilayer interconnect may be used and include copper, copper alloy, titanium, titanium nitride, tantalum, tantalum nitride, tungsten, polysilicon, metal silicide, or combinations thereof. The copper multilayer interconnect may be formed by a technique including CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

In an embodiment, an interlayer dielectric (inter-level dielectric or ILD) 106b is included to isolate the multilayer interconnect 106a disposed therein. The interlayer dielectric structure 106b may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD 106b may be formed by a technique including spin-on, CVD, sputtering, or other suitable processes. The MLI 106a and ILD 106b may be formed in an integrated process including a damascene process such as dual damascene processing or single damascene processing.

Figure 5:
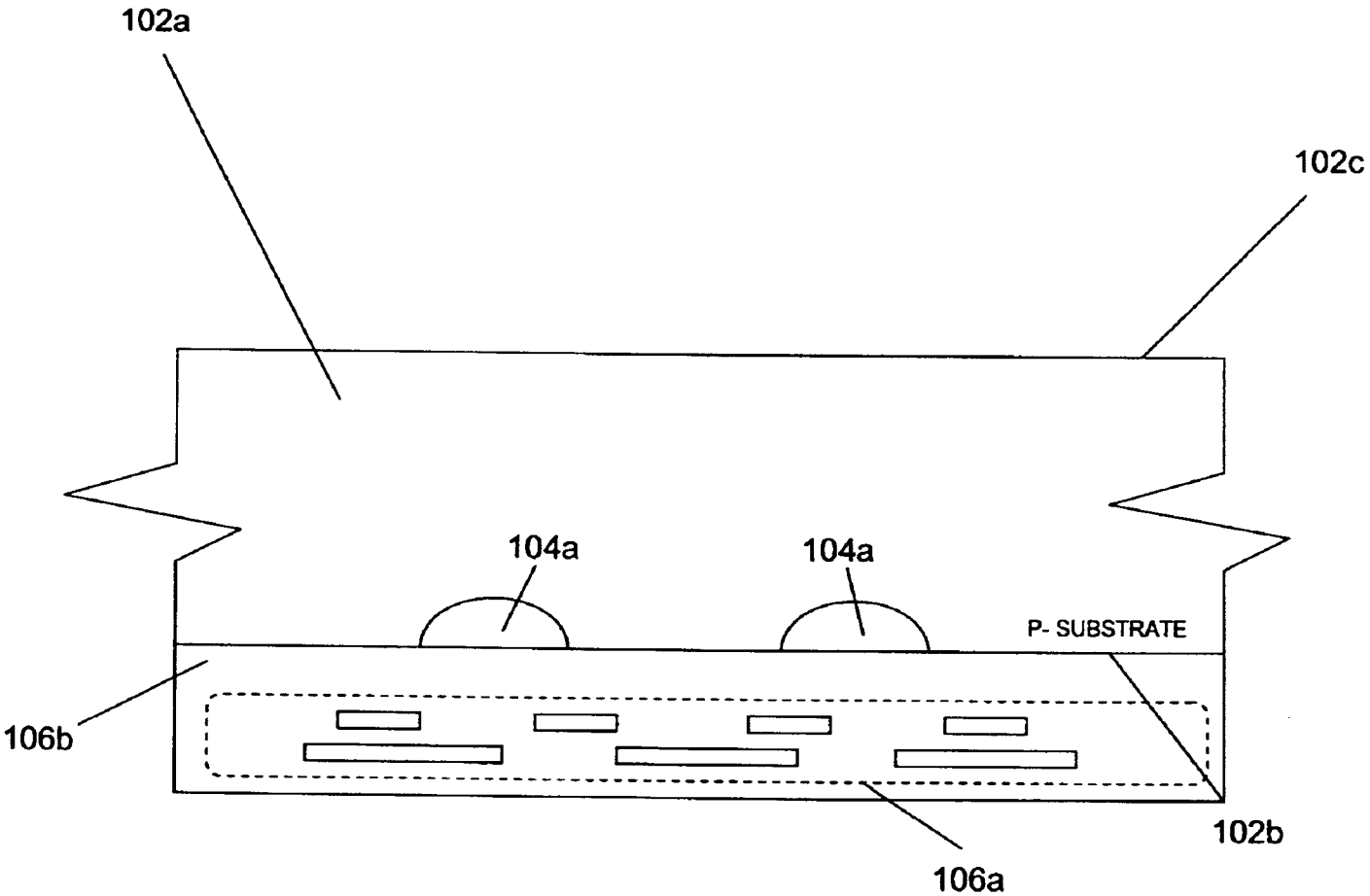
FIG. 5 illustrates a cross sectional view of one embodiment of the semiconductor substrate of FIG. 4 inverted according to aspects of the present disclosure.
Figure 6:
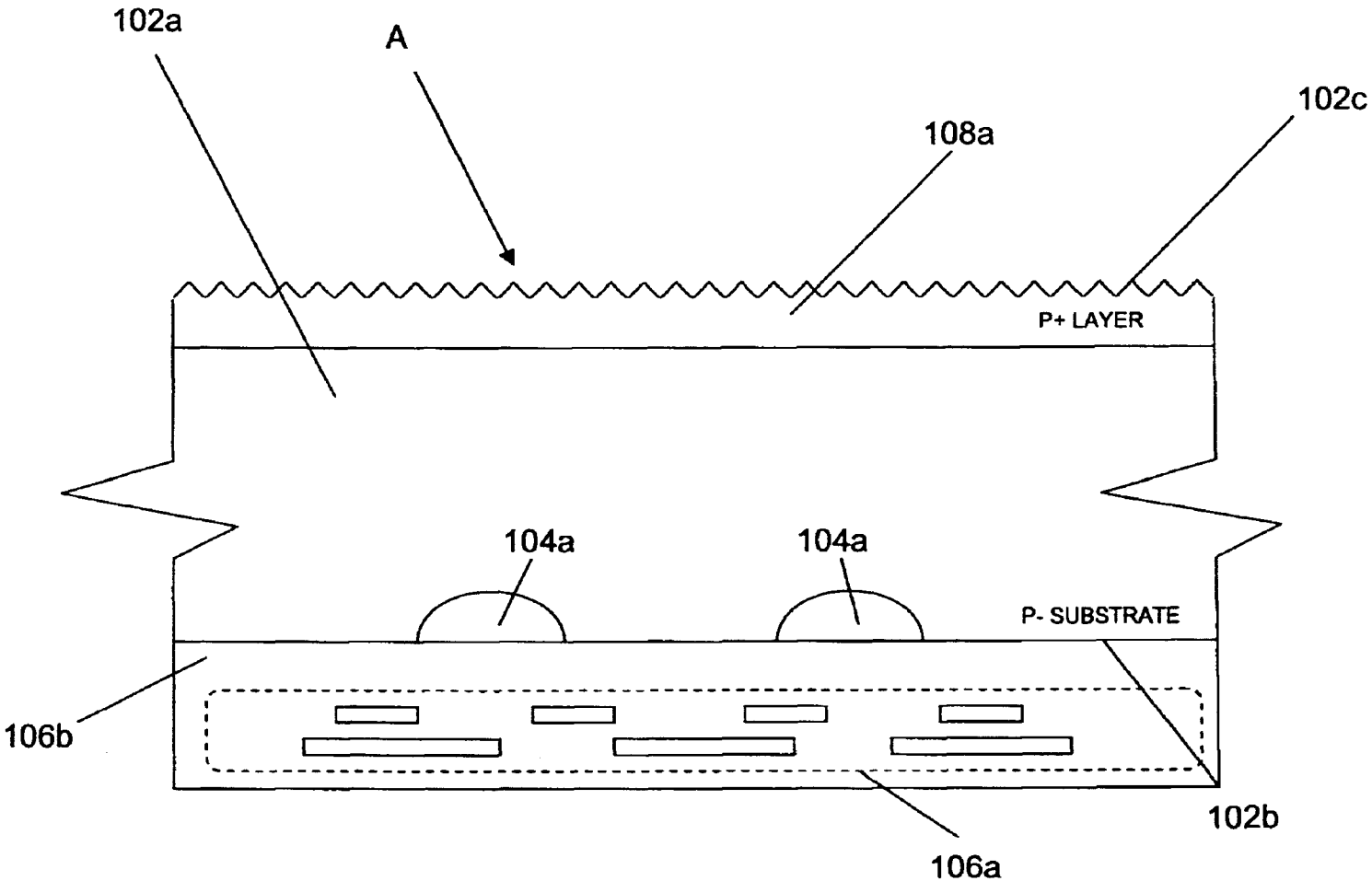
FIG. 6 illustrates a cross sectional view of one embodiment of a positive type dopant layer formed on the semiconductor substrate of FIG. 5 according to aspects of the present disclosure.

Referring now to FIGS. 1, 5 and 6, the method 100 proceeds to step 108 where a positive type dopant layer is formed adjacent the second surface 102c of the semiconductor substrate 102a. In an embodiment, the semiconductor substrate 102 is inverted, as illustrated in FIG. 5. A localized annealing process such as, for example, laser annealing, is then used to activate an ion implant in order to form a positive type dopant layer 108a located adjacent the second surface 102c of the semiconductor substrate 102a. A localized annealing process provides concentrated energy to a local region of the second surface 102c of the semiconductor substrate 102a for efficient annealing effect. Other proper localized annealing processes may alternatively be used. The localized annealing process performed in step 108 of the method 100 in order to form the positive type dopant layer 108a results a surface roughness A and a plurality of crystal defects on the second surface 102c of the semiconductor substrate 102a. In an embodiment, the surface roughness A of second surface 102c of the semiconductor substrate 102a after localized annealing process is approximately 100 to 1000 Angstroms.

Figure 7:
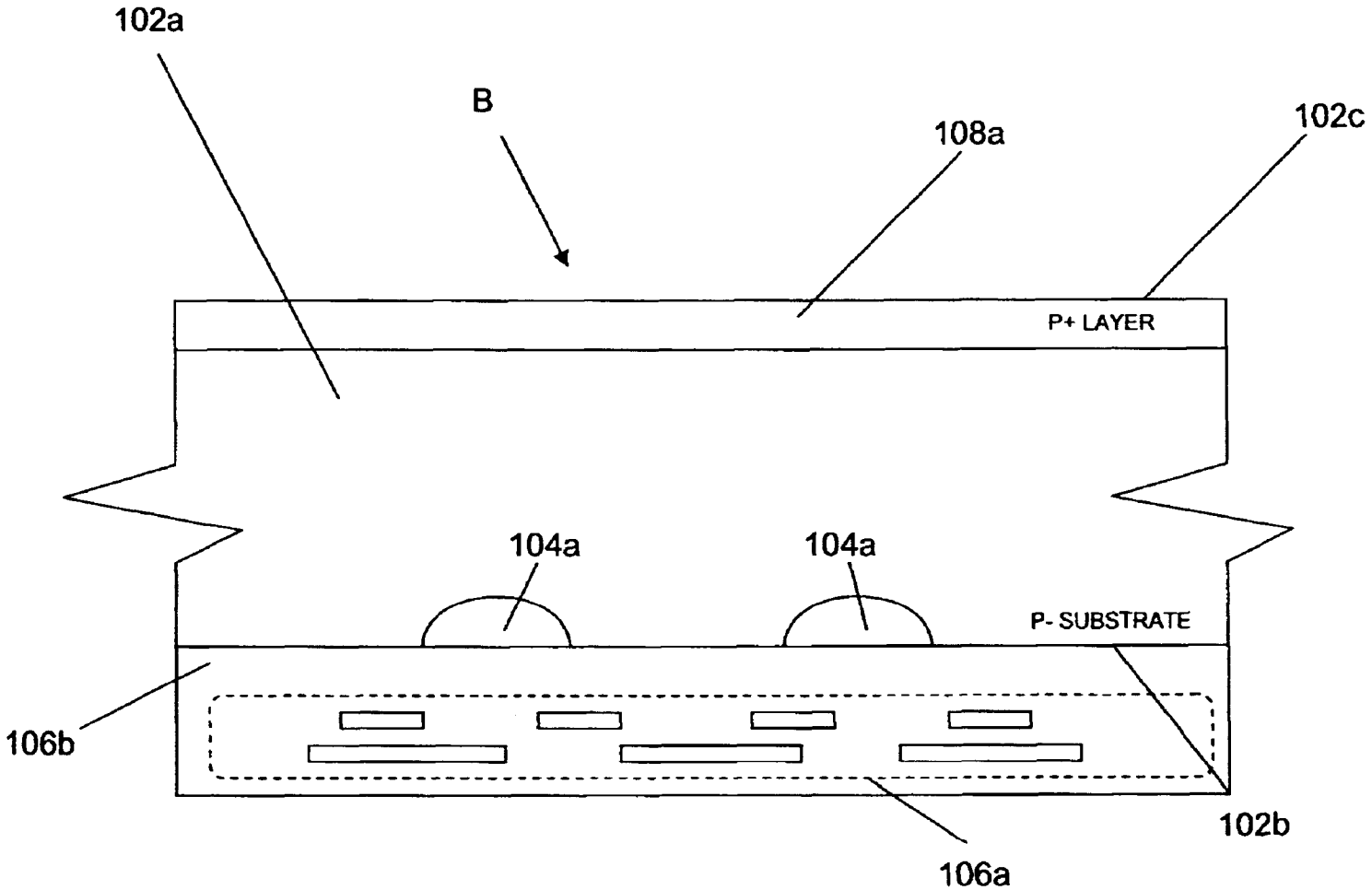
FIG. 7 illustrates a cross sectional view of one embodiment of the positive type dopant layer on the semiconductor substrate of FIG. 6 after etching according to aspects of the present disclosure.

Referring now to FIGS. 1 and 7, the method 100 proceeds to step 110 where the second surface 102c of the semiconductor substrate 102a is etched. An etchant is applied to the second surface 102c of the semiconductor substrate 102a in order to reduce the surface roughness A of the second surface 102c, illustrated in FIG. 6, to a surface roughness B. The etchant may utilize a wet chemical etchant. In an embodiment, the etchant may be an alkaline solution of ammonia water and aqueous amine. In an embodiment, the etchant may be Tetramethyl ammonium hydroxide (TMAH), ethylenediamene pyrocatecol (EDP), an Alkaline Hydroxide such as, for example, KOH, NaOH, CeOH, and/or RbOH, and/or a variety of other etchants known in the art. In an embodiment, the etching of step 110 in method 100 is carried out at a temperature between approximately 20 to 50 degrees Celcius. In an embodiment, the etching of step 110 in method 100 is carried out for a duration of between approximately 2 to 10 minutes. In an embodiment, the etching of step 110 in method 100 is carried out at an etch rate of between approximately 100 to 300 Angstroms per minute. In an embodiment, the surface roughness B after etching is reduced to less than approximately 20 Angstroms such as, for example, in a range of between approximately 10 and 20 Angstroms.

Figure 8:
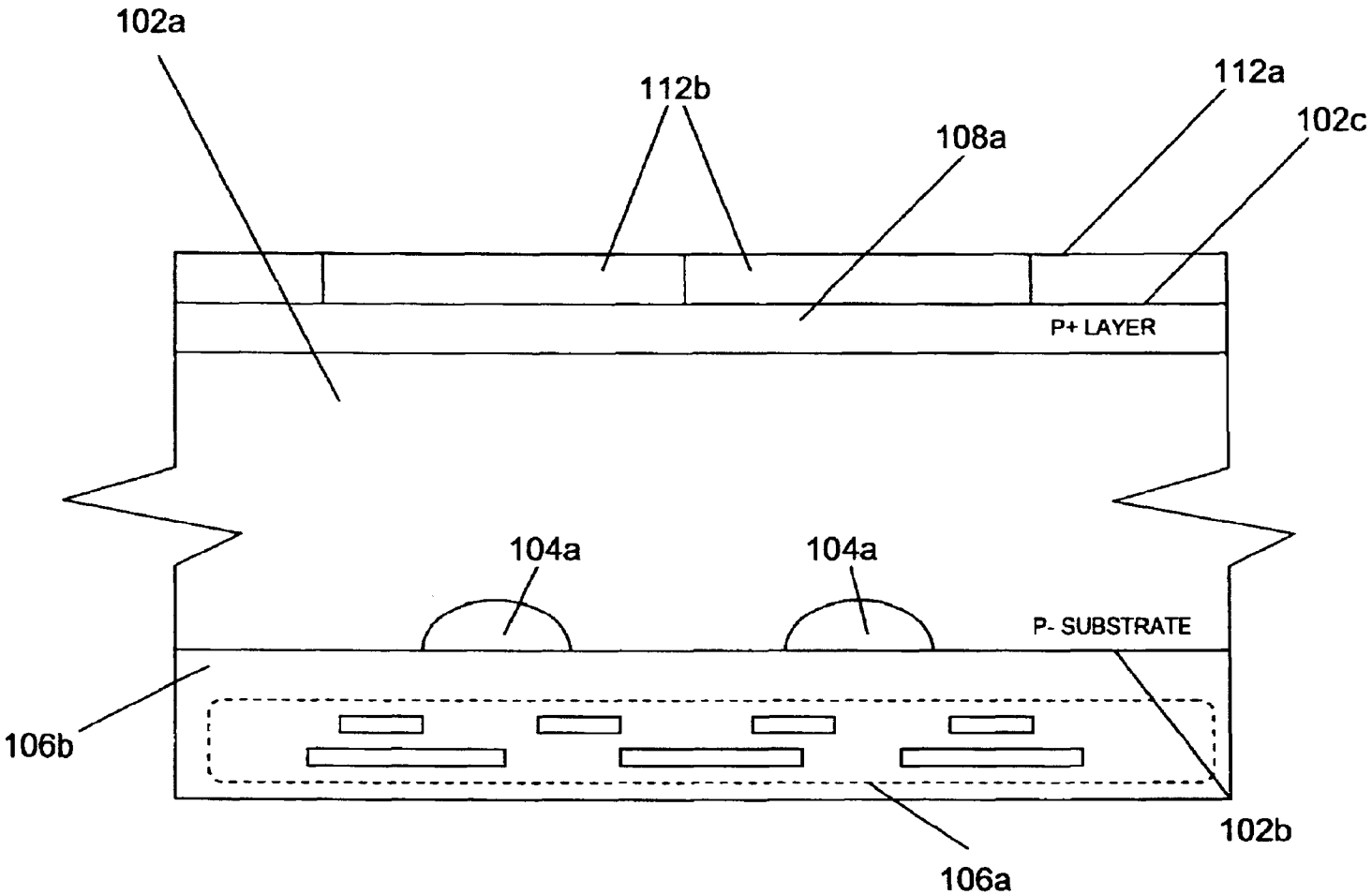
FIG. 8 illustrates a cross sectional view of one embodiment of a plurality of color filters formed adjacent the positive type dopant layer on the semiconductor substrate of FIG. 7 according to aspects of the present disclosure.

Referring now to FIGS. 1 and 8, the method 100 proceeds to step 112 where a plurality of color filters are formed on the second surface 102c of the semiconductor substrate 102a and adjacent the positive type dopant layer 108a. A color filter layer 112a is formed on the second surface 102c of the semi conductor substrate 102a using methods known in the art. The color filter layer 112a includes a plurality of color filters 112b which may include several different color filters such as, for example, a red filter, a green filter, and a blue filter. The color filters 112b may be positioned such that incident light is directed thereon and therethrough. In an embodiment, the color filters 112b may comprise a polymeric material (e.g. negative photoresist based on an acrylic polymer) or resin. The color filter layer 112a may comprise negative photoresist based on an acrylic polymer including color pigments.

Figure 9:
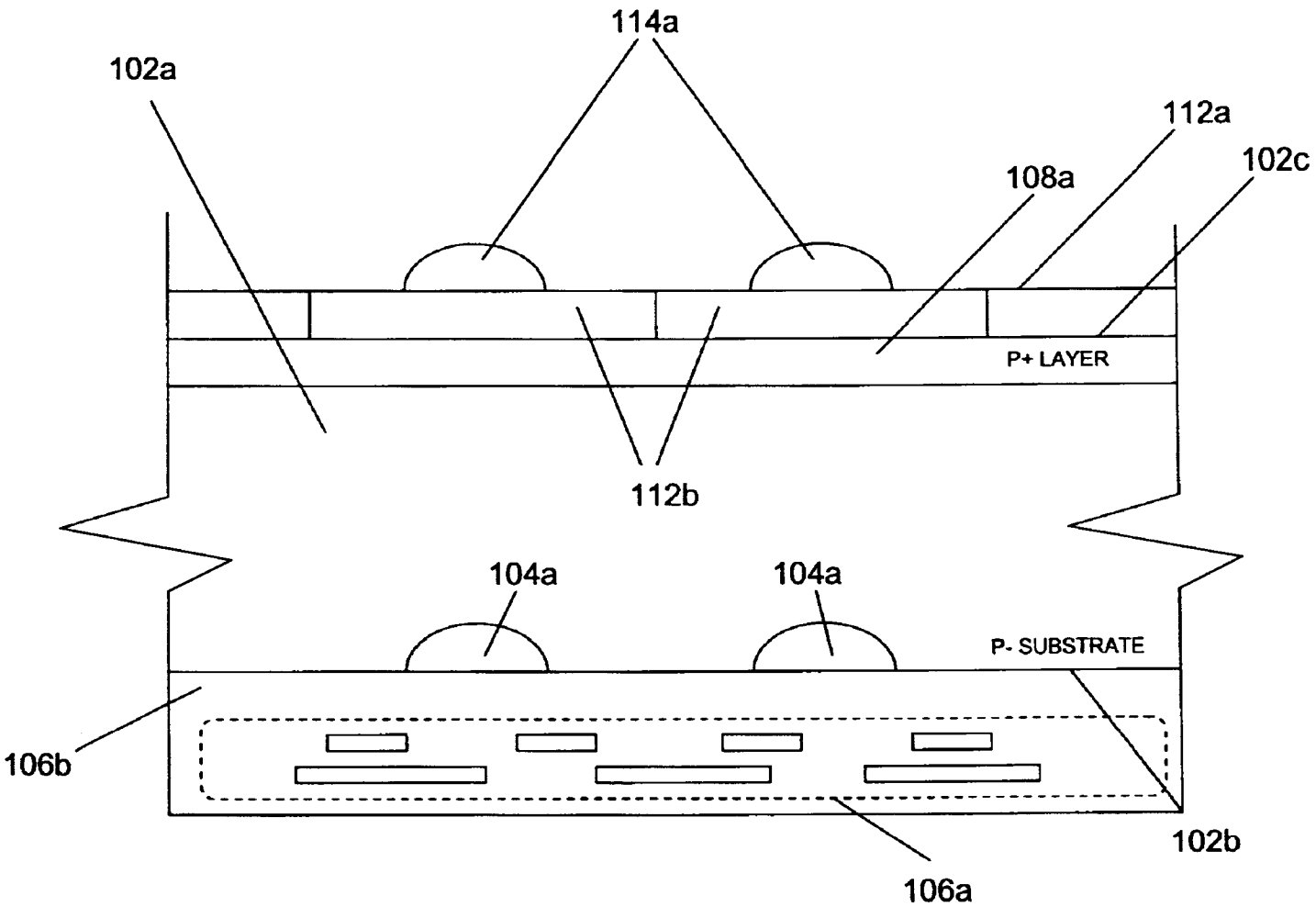
FIG. 9 illustrates a cross sectional view of one embodiment of a plurality of micro lenses formed adjacent the color filters on the semiconductor substrate of FIG. 8 according to aspects of the present disclosure.

Referring now to FIGS. 1 and 9, the method 100 proceeds to step 114 where a plurality of micro lenses are formed adjacent the color filters 112b. A plurality of micro lenses 114a are formed adjacent the color filters 112b using methods known in the art. In operation, illuminated light may be directed at the micro lenses 114a, filtered through the color filters 112b, and sensed by the imaging sensors 104a.

In the disclosed structure and the method to make the same, the illuminated light during operation may not be limited to visual light beam, it can be extended to other optical light such as infrared (IR) and ultraviolet (UV), and other proper radiation beams. Other processes may be implemented in the method 100. In one embodiment, a passivation layer may be formed on the multiple layer interconnect 106a and an anti-reflective coating (ARC) may be formed on the positive type dopant layer 108a. In another embodiment, the semiconductor substrate 102a may be thinned from the second surface 102c using a proper process such as, for example, grinding.

Thus, the present disclosure provides a method for fabricating a semiconductor device. In one embodiment, the method includes providing a semiconductor substrate comprising a first surface and a second surface, wherein at least one imaging sensor is located adjacent the first surface, activating a dopant layer in the semiconductor substrate adjacent the second surface using a localized annealing process, and etching the dopant layer.

The present disclosure also provides a method for fabricating a backside illuminated imaging sensor. In one embodiment, the method includes providing a semiconductor substrate having a first surface and a second surface, forming a plurality of imaging sensors on the first surface, forming a positive type dopant layer on the second surface, forming a plurality of color filters on the positive type dopant layer, and forming a plurality of micro lenses adjacent the color filters.

The present disclosure also provides a backside illuminated semiconductor device. In one embodiment, the device includes a semiconductor substrate having a first surface and a second surface, a plurality of imaging sensors formed in the semiconductor substrate adjacent the first surface, a positive type dopant layer formed in the semiconductor substrate adjacent the second surface, wherein the positive type dopant layer comprises a thickness between approximately 500 and 5000 Angstroms, a plurality of color filters formed adjacent the positive type dopant layer, and a plurality of micro lenses formed adjacent the color filters.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a backside illuminated imaging sensor, comprising:

providing a semiconductor substrate having a first surface and a second surface;

forming a plurality of imaging sensors on the first surface; *and* forming a positive type dopant layer on the second surface[;], *wherein forming the positive type dopant layer on the second surface includes activating the positive type dopant on the second surface with a localized annealing process.*

[forming a plurality of color filters on the positive type dopant layer; and forming a plurality of micro lenses adjacent the color filters.]

2. The method of claim 1, further comprising etching the second surface to provide a surface roughness on the second surface of less than approximately 20 Angstroms.

3. The method of claim 1, further comprising:

forming a multi layer interconnect on the first surface adjacent the plurality of imaging sensors.

4. The method of claim 1, further comprising etching the second surface with wet chemical etching.

5. The method of claim 4, wherein the wet chemical etching comprises etching with an alkaline solution of ammonia water and aqueous amine.

6. The method of claim 4, wherein the wet chemical etching comprises etching with an etchant chosen from the group consisting of Tetra-methyl ammonium hydroxide (TMAH), ethylenediamene pyrocatecol (EDP), and an Alkali Hydroxide (Alkali-OH).

7. A backside illuminated semiconductor device, comprising:

a semiconductor substrate having a first surface and a second surface;

a plurality of imaging sensors formed in the semiconductor substrate adjacent the first surface;

a positive type dopant layer formed in the semiconductor substrate adjacent the second surface, wherein the positive type dopant layer comprises a thickness between approximately 500 to 5000 Angstroms; *and* a plurality of color filters formed [adjacent] *directly on* the positive type dopant layer[; and].

[a plurality of micro lenses formed adjacent the color filters.]

8. The device of claim 7, wherein the positive type dopant layer is fabricated by a process comprising:

activating a P+ ion implant layer with a localized annealing process; and etching the P+ ion implant layer.

9. The device of claim 8, wherein the second surface has a surface roughness of less than approximately 20 Angstroms.

10. The method of claim 1, wherein the forming of the positive type dopant layer on the second surface includes:

forming an ion implant layer in the semiconductor substrate; and locally annealing the ion implant layer.

11. The method of claim [1] *15*, wherein the forming of the plurality of micro lenses is carried out so that the micro lenses are on a side of the color filters opposite from the positive type dopant layer.

12. The method of claim 1, further comprising etching the second surface, wherein the etching reduces a roughness of the second surface.

13. The device of claim [7] *16*, wherein the micro lenses are disposed on a side of the color filters opposite from the positive type dopant layer.

14. The device of claim 7, wherein the second surface has a surface roughness of less than approximately 20 Angstroms.

*15. The method of claim 1, further comprising:*

*forming a plurality of color filters on the positive type dopant layer; and*

*forming a plurality of micro lenses adjacent the color filters.*

*16. The backside illuminated semiconductor device of claim 7, further comprising:*

*a plurality of micro lenses formed adjacent the color filters.*

* * * * *